United States Patent
Miura et al.

(10) Patent No.: US 7,872,906 B2
(45) Date of Patent: Jan. 18, 2011

(54) UNIDIRECTIONAL-CURRENT MAGNETIZATION-REVERSAL MAGNETORESISTANCE ELEMENT AND MAGNETIC RECORDING APPARATUS

(75) Inventors: Katsuya Miura, Sendai (JP); Jun Hayakawa, Hino (JP); Hiromasa Takahashi, Hachioji (JP); Kenchi Ito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 215 days.

(21) Appl. No.: 12/337,657

(22) Filed: Dec. 18, 2008

(65) Prior Publication Data

US 2009/0180312 A1 Jul. 16, 2009

(30) Foreign Application Priority Data

Dec. 19, 2007 (JP) .............................. 2007-326700

(51) Int. Cl.
*G11C 11/00* (2006.01)

(52) U.S. Cl. ................... 365/158; 365/171; 365/173

(58) Field of Classification Search ................ 365/158, 365/171, 173
See application file for complete search history.

(56) References Cited

U.S. PATENT DOCUMENTS 7,149,106 B2 * 12/2006 Mancoff et al. ............. 365/158
7,266,012 B2 * 9/2007 Saito et al. ................. 365/158
2007/0019463 A1 * 1/2007 Saito et al. ................. 365/158

OTHER PUBLICATIONS

Luc Thomas, et al., Oscillatory Dependence of Current-Driven Magnetic Domain Wall Motion on Current Pulse Length, (Sep. 2006) vol. 443/14, pp. 197-200, Nature Publishing Group.
Luc Thomas, et al., Resonant Amplification of Magnetic Domain-Wall Motion by a Train of Current Pulses, Science 315, (2007) pp. 1553-1556.

* cited by examiner

*Primary Examiner*—Son Dinh
(74) *Attorney, Agent, or Firm*—Antonelli, Terry, Stout & Kraus, LLP.

(57) ABSTRACT

A memory for which writing is conducted by using a unidirectional write current. Currents which differ in current pulse width are applied to a magnetoresistance element in a film thickness direction of the magnetoresistance element consisting of a first ferromagnetic layer having a fixed magnetization direction, a second ferromagnetic layer having a variable magnetization direction, a third ferromagnetic layer having a variable magnetization direction, a first non-magnetic layer located between the first ferromagnetic layer and the second ferromagnetic layer, and a second non-magnetic layer located between the second ferromagnetic layer and the third ferromagnetic layer, to reverse a magnetization direction of either the second ferromagnetic layer or the third ferromagnetic layer by using a spin-transfer torque.

20 Claims, 6 Drawing Sheets

US 7,872,906 B2

UNIDIRECTIONAL-CURRENT MAGNETIZATION-REVERSAL MAGNETORESISTANCE ELEMENT AND MAGNETIC RECORDING APPARATUS

INCORPORATION BY REFERENCE

The present application claims priority from Japanese application JP 2007-326700 filed on Dec. 19, 2007, the content of which is hereby incorporated by reference into this application.

BACKGROUND OF THE INVENTION

The present invention relates to a magnetic recording/reproducing memory including magnetoresistance elements which use the magnetization reversal or magnetic reversal technique using spin-transfer torque and in which magnetization-reversal is caused with a unidirectional current.

Currently in the field of memories represented by the dynamic random access memory (DRAM), research and development of universal memories which satisfy requirements of fast speed, high integration and low power consumption and which has a feature of non-volatility are being conducted worldwide. The magnetic random access memory (MRAM) is highly expected as a candidate for the universal memory.

The MRAM has a structure obtained by arranging tunnel magnetoresistance (TMR) elements in an array form. The TMR element is based on a structure having an insulation layer sandwiched between two ferromagnetic layers, the insulation layer being used as a tunnel barrier. The TMR effect is an effect in which the resistance of the TMR element changes greatly depending upon whether the magnetization directions of the two ferromagnetic materials are parallel or anti-parallel with each other. In 1990's, TMR elements using aluminum oxide in the insulation layer have been researched. In the case where magnesium oxide which has attracted attention in recent years is used in the insulation layer, a resistance change rate as large as 500% is reported. They are described in, for example, Luc Thomas, Masamitsu Hayashi, Xin Jiang, Rai Moriya, Charles Rettner, and Stuart S. P. Parkin, "Oscillatory dependence of current-driven magnetic domain wall motion on current pulse length", Nature 443, 197 (2006) (non-patent document 1). In addition, according to Luc Thomas, Masamitsu Hayashi, Xin Jiang, Rai Moriya, Charles Rettner, and Stuart Parkin, "Resonant Amplification of Magnetic Domain-Wall Motion by a Train of Current Pulses", Science 315, 1553 (2007) (non-patent document 2), writing with a current using magnetization reversal caused by the spin-transfer torque at the time of writing is also verified at an array level.

SUMMARY OF THE INVENTION

In the MRAM using the TMR element in a memory cell, writing is conducted by using current magnetization reversal caused by spin-transfer torque according to bit information of "0" or "1" to be written. When rewriting "0" to "1", a current is applied in a direction in which electrons move from the free layer toward the fixed layer or pinned layer.

As for electrons which pass through the free layer and arrive at the fixed layer in this case, only electrons spin-polarized in the same direction as the magnetization direction of the fixed layer pass through the fixed layer, whereas electrons spin-polarized in the opposite direction are reflected. Since the reflected electrons give a torque to the free layer, magnetization of the free layer becomes opposite in direction to that of the fixed layer. Therefore, the TMR element becomes high in resistance.

Conversely, when rewriting "1" to "0", a current is applied in a direction in which electrons move from the fixed layer toward the free layer. Electrons which have passed through the fixed layer are spin-polarized in the same direction as the magnetization of the fixed layer. Since the electrons give a torque to the free layer, magnetization of the free layer becomes the same in direction to that of the fixed layer. Therefore, the TMR element becomes low in resistance.

For implementing this writing operation, it is necessary to apply a current which is upward with respect to the film thickness direction of the TMR element and a current which is downward with respect to the film thickness direction. In the MRAM using the TMR element as a memory cell, therefore, a circuit which lets flow bidirectional currents is needed. For fabricating such a circuit, a switching circuit using a transistor is indispensable. It is necessary to provide one transistor for each memory cell. As a result, the cell size of the MRAM becomes large, resulting in a lowered degree of memory integration. In the MRAM under the present state, the degree of integration is nearly equal to that of the DRAM and it is difficult to implement a large capacity as in the NAND flash memory.

In order to achieve the object, a memory element according to one aspect of the present invention includes a first ferromagnetic layer having a fixed magnetization direction, a second ferromagnetic layer having a variable magnetization direction, a third ferromagnetic layer having a variable magnetization direction, a first non-magnetic layer located between the first ferromagnetic layer and the second ferromagnetic layer, and a second non-magnetic layer located between the second ferromagnetic layer and the third ferromagnetic layer, and means for applying a current in a film thickness direction of the magnetoresistance element. A magnetization direction of the second ferromagnetic layer and a magnetization direction of the third ferromagnetic layer are substantially anti-parallel with each other. At the time of a write operation, currents which differ in current pulse width are applied in a film thickness direction of the magnetoresistance element to cause a spin-transfer torque to act on either the second ferromagnetic layer or the third ferromagnetic layer and cause magnetization reversal therein.

A memory element according to another aspect of the present invention includes a plurality of first wiring lines (hereinafter referred to as first lines) disposed substantially in parallel, a plurality of second wiring lines (hereinafter referred to as second lines) disposed so as to intersect the first lines and be substantially in parallel with each other, a plurality of magnetoresistance elements disposed at intersections of the first lines and the second lines, and switching elements disposed respectively between the magnetoresistance elements and the first lines. Each of the magnetoresistance elements includes a first ferromagnetic layer having a fixed magnetization direction, a second ferromagnetic layer having a variable magnetization direction, a third ferromagnetic layer having a variable magnetization direction, a first non-magnetic layer located between the first ferromagnetic layer and the second ferromagnetic layer, and a second non-magnetic layer located between the second ferromagnetic layer and the third ferromagnetic layer. A magnetization direction of the second ferromagnetic layer and a magnetization direction of the third ferromagnetic layer are substantially anti-parallel with each other. The third ferromagnetic layer is electrically connected to an associated one of the second lines and the first ferromagnetic layer is electrically connected to an associated one of the first lines via an associated one of the switching elements. At the time of a write operation, currents which differ in current pulse width are applied between one of the first lines and one of the second lines so as to pass through one of the magnetoresistance elements to reverse the magnetization direction of either the second ferromagnetic layer or the third ferromagnetic layer by using a spin-transfer torque.

In a write operation method for recording information by using a spin-transfer torque according to still another aspect of the present invention, the magnetic memory element includes a magnetoresistance element, and means for applying a current in a film thickness direction of the magnetoresistance element, the magnetoresistance element includes a first ferromagnetic layer having a fixed magnetization direction, a second ferromagnetic layer having a variable magnetization direction, a third ferromagnetic layer having a variable magnetization direction, a first non-magnetic layer located between the first ferromagnetic layer and the second ferromagnetic layer, and a second non-magnetic layer located between the second ferromagnetic layer and the third ferromagnetic layer, and a magnetization direction of the second ferromagnetic layer and a magnetization direction of the third ferromagnetic layer are substantially anti-parallel with each other, and currents which differ in current pulse width are applied in a film thickness direction of the magnetoresistance element to cause a spin-transfer torque to act on either the second ferromagnetic layer or the third ferromagnetic layer and cause magnetization reversal therein.

It is preferable to make the current pulse width differ according to information to be written and design the second ferromagnetic layer and the third ferromagnetic layer so as to make them correspond to the current pulse widths.

According to the present invention, it becomes unnecessary to apply bidirectional currents to the magnetoresistance element unlike the conventional technique, and a memory for which writing is conducted by using a unidirectional write pulse current can be implemented. By making it unnecessary to mount the circuit for applying bidirectional currents, the area of the memory cell reduces to, for example, approximately half to one third.

Furthermore, it is possible to reduce the magnitude of the write current by making the pulse width of the write pulse current coincide with an integer times the period of the precession motion. As a result, it becomes possible to further reduce the power dissipation of the memory.

Other objects, features and advantages of the invention will become apparent from the following description of the embodiments of the invention taken in conjunction with the accompanying drawings.

DETAILED DESCRIPTION OF THE EMBODIMENTS

Hereafter, a unidirectional-current magnetization-reversal magnetoresistance element and a magnetic recording apparatus according to the present invention will be described in detail with reference to the drawings.

First Embodiment

Figure 1A:
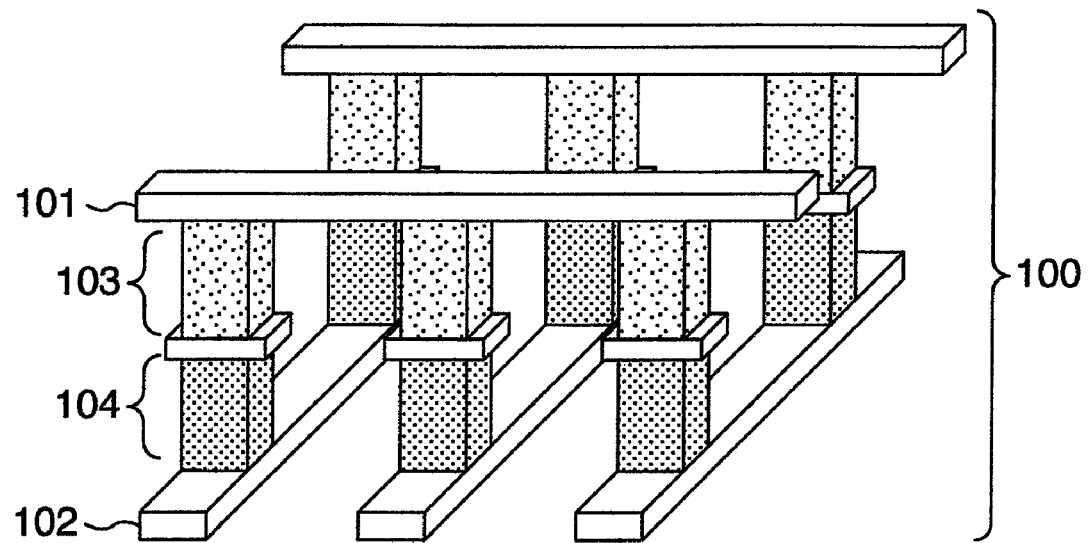
FIG. 1A is a schematic diagram of a magnetic memory according to a first embodiment of the present invention.
Figure 1B:
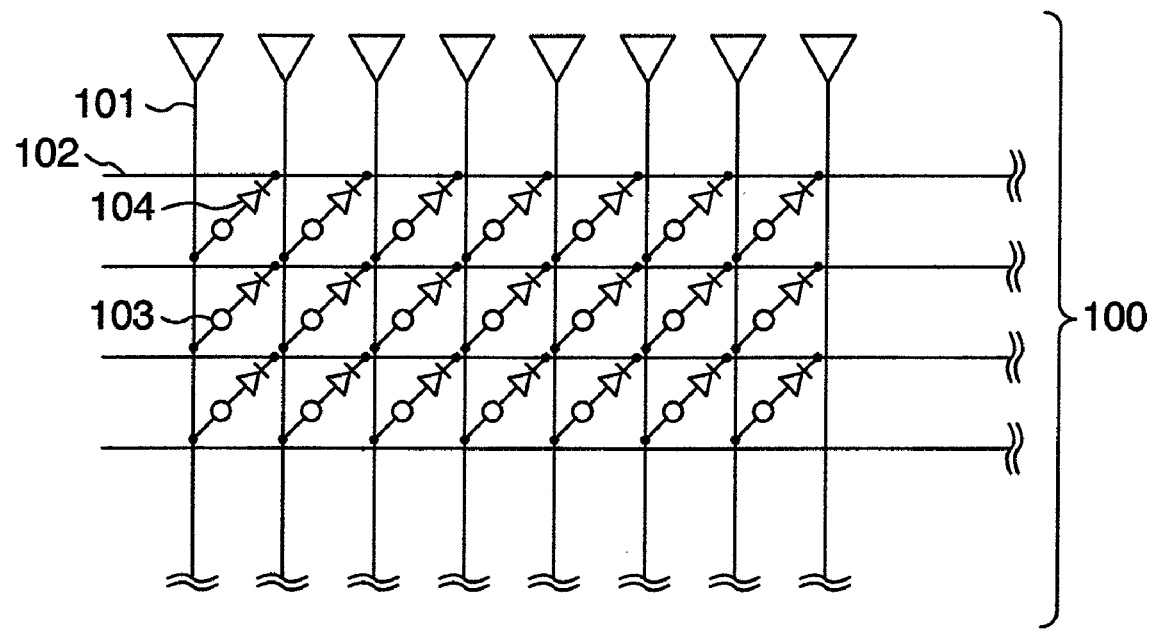
FIG. 1B is a circuit diagram of the magnetic memory shown in FIG. 1A.

FIGS. 1A and 1B show a magnetic memory 100 according to the present invention. The magnetic memory 100 includes a plurality of bit lines 101 arranged in parallel with each other and a plurality of word lines 102 arranged in parallel with each other so as to intersect the bit lines 101. At each of intersections of the bit lines 101 and the word lines 102, a memory element 103 and a switching element 104 are disposed. As shown in FIGS. 1A and 1B, they are electrically connected from a bit line 101 to a source line via a memory element 103 and a switching element 104.

Figure 2:
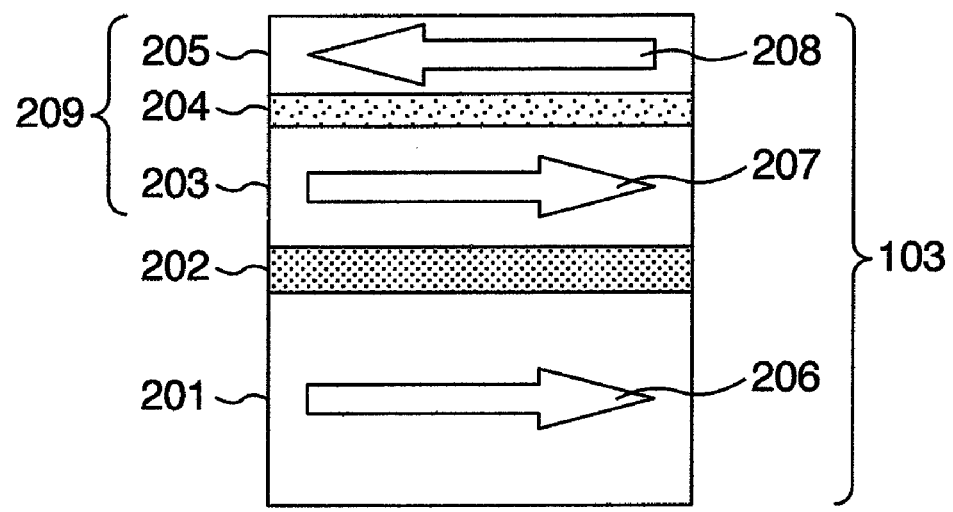
FIG. 2 is a sectional view of a magnetoresistance element.

FIG. 2 is a concept diagram of the magnetoresistance element 103. The magnetoresistance element 103 has a structure obtained by laminating or stacking a first ferromagnetic layer 201, a first non-magnetic layer 202, a second ferromagnetic layer 203, a second non-magnetic layer 204 and a third ferromagnetic layer 205 in this order. Magnetization 206 of the first ferromagnetic layer 201 is fixed to one direction. Therefore, the first ferromagnetic layer 201 functions as a fixed layer in the magnetoresistance element 103. Magnetization 207 of the second ferromagnetic and magnetization 208 of the third ferromagnetic layer 205 are coupled in anti-parallel with each other via the second non-magnetic layer 204. Therefore, the second ferromagnetic layer 203, the second non-magnetic layer 204 and the third ferromagnetic layer 205 function as a free layer 209 in the magnetoresistance element 103 (this is a so-called Synthetic Ferrimagnetic Free Layer structure).

The second ferromagnetic layer 203 and the third ferromagnetic layer 205 are controlled so as to differ from each other in precession motion period of magnetization. The precession motion period of magnetization depends upon, for example, the film thickness, magnitude of coercive force, and magnitude of magnetization of each ferromagnetic layer. Therefore, it is possible to control the precession motion period of magnetization of each of the second ferromagnetic layer 203 and the third ferromagnetic layer 205 by changing its film thickness and material. Incidentally, in the magnetoresistance element 103 shown in FIGS. 4A and 4B, the film thickness of the second ferromagnetic layer is made different from that of the third ferromagnetic layer.

Figure 3:
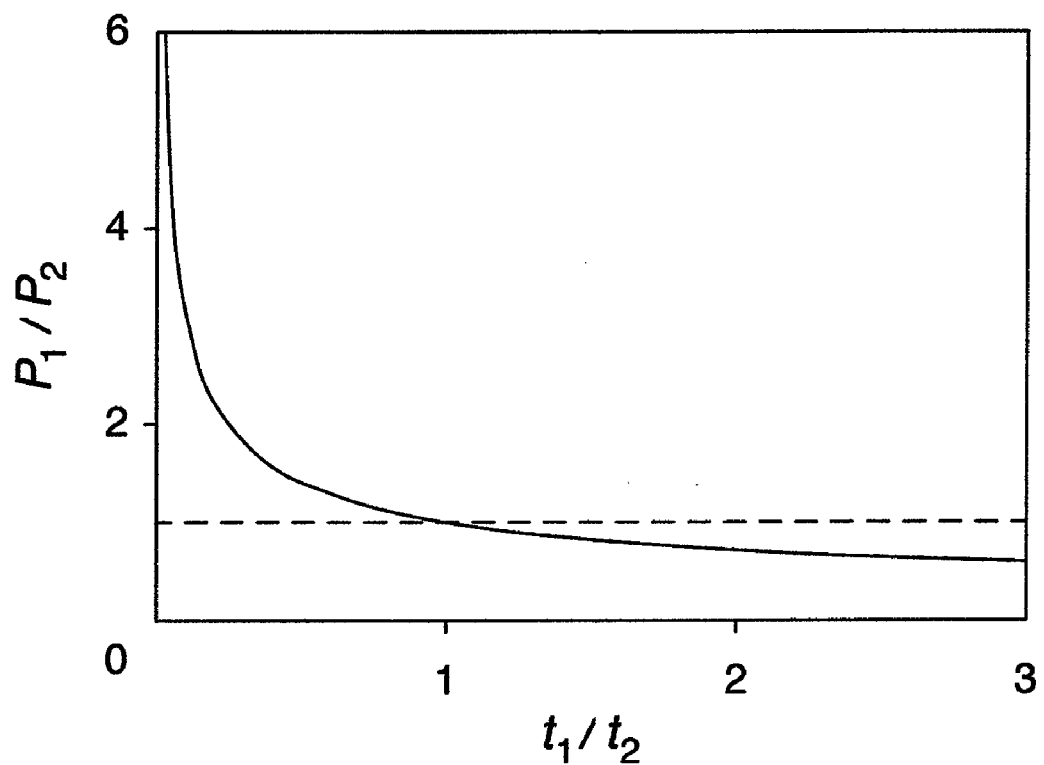
FIG. 3 shows a ratio of a precession motion frequency of a second ferromagnetic layer to that of a third ferromagnetic layer as a function of a ratio of a film thickness of the second ferromagnetic layer to that of the third ferromagnetic layer.

Denoting the film thickness of the second ferromagnetic layer 203 by $t_1$, the period of the precession motion of the second ferromagnetic layer 203 by $P_1$, the film thickness of the third ferromagnetic layer 205 by $t_2$, and the period of the precession motion of the third ferromagnetic layer 205 by $P_2$, the relation between $t_1/t_2$ and $P_1/P_2$ becomes as shown in FIG. 3. If $t_1/t_2$ becomes large, $P_1/P_2$ also becomes large. Therefore, by making the film thickness difference between the second ferromagnetic layer 203 and the third ferromagnetic layer 205 large, the difference in precession motion period can be made large.

When the magnetization 206 of the first ferromagnetic layer 201 and the magnetization 207 of the second ferromagnetic layer 203 are disposed so as to respectively have directions which are parallel with each other, the magnetoresistance element 103 is brought into a low resistance state. When the magnetization 206 of the first ferromagnetic layer 201 and the magnetization 207 of the second ferromagnetic layer 203 are disposed so as to respectively have directions which are anti-parallel with each other, the magnetoresistance element 103 is brought into a high resistance state.

Figure 4A:
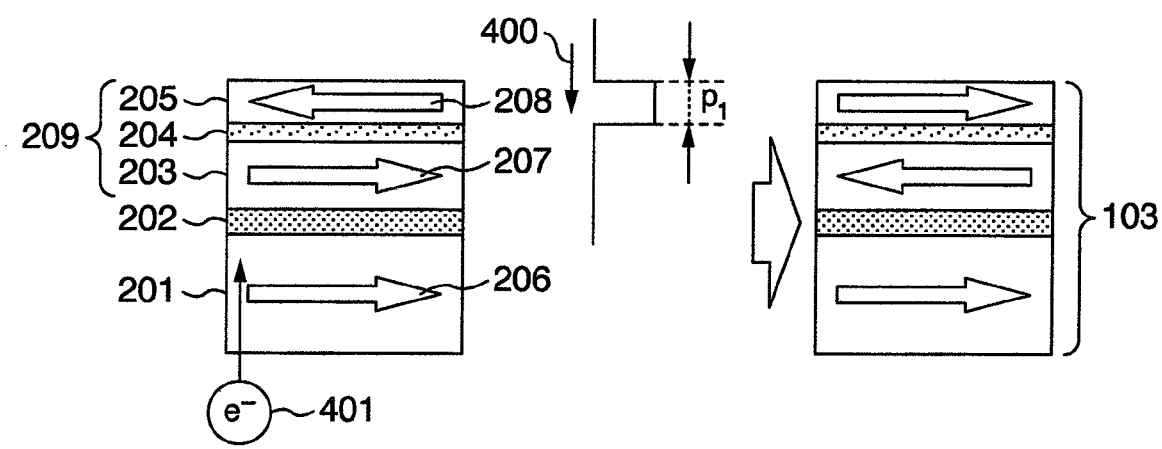
FIG. 4A is a schematic diagram showing an operation principle of the magnetoresistance element shown in FIG. 2.

It is now supposed that the magnetization 206 of the first ferromagnetic layer 201 and the magnetization 207 of the second ferromagnetic layer 203 are disposed so as to respectively have directions which are parallel with each other as shown in FIG. 4A. At the time of writing, a write pulse current 400 is applied in a direction oriented from the third ferromagnetic layer 205 to the first ferromagnetic layer 201.

Electrons are conducted from the first ferromagnetic layer 201 to the third ferromagnetic layer 205. Electrons 401 are polarized in the same direction as that of the magnetization 206 of the first ferromagnetic layer 201, and the electrons 401 pass through the second ferromagnetic layer 203 via the first non-magnetic layer 202. Since the spin of the conducted electrons is in the same direction as the magnetization 207 of the second ferromagnetic layer 203 at this time, magnetization reversal due to spin-transfer torque is not caused. In addition, the conducted electrons arrive at the third ferromagnetic layer 205 via the second non-magnetic layer 204. Here, since the spin of the conducted electrons is opposite in direction to the magnetization 208 of the third ferromagnetic layer 205, magnetization reversal due to the spin-transfer torque is caused in the magnetization 208.

A pulse width $P_1$ of the write pulse current is made to coincide with an integer times the precession motion period of the magnetization 208 of the third ferromagnetic layer 205. As described in the non-patent document 1 and the non-patent document 2, the pulse width $P_1$ is in proportion to $(H_k t_1 / M_s)^{-1/2}$. Since $H_k$ is coercive force and $M_s$ is saturation magnetization, the precession motion period of the magnetization depends upon the material and film thickness. The spin of electrons conducted in the film thickness direction of the TMR element by an applied pulse current having a pulse width which coincides with an integer times the precession motion period of the magnetization can provide the magnetization with a torque efficiently. Therefore, the write pulse current can provide only the magnetization 208 of the third ferromagnetic layer 205 with a torque efficiently.

According to the non-patent document 1 and the non-patent document 2, the current value can be reduced to one fifth by making the pulse width of the write pulse current coincide with an integer times the period of the precession moment, as compared with the case where the pulse width of the write pulse current is not made to coincide with an integer times the period of the precession moment. The magnetization 207 of the second ferromagnetic layer 203 and the magnetization 208 of the third ferromagnetic layer 205 are in anti-ferromagnetic coupling with each other. Concurrently with magnetization reversal of the magnetization 208 of the third ferromagnetic layer 205, therefore, the magnetization 207 of the second ferromagnetic layer 203 also reverses. As a result, the magnetization 206 of the first ferromagnetic layer 201 and the magnetization 207 of the second ferromagnetic layer 203 are disposed so as to respectively have directions which are anti-parallel with each other.

If the write pulse current continues to flow after this change of the disposition, then a torque caused by spin transfer acts on the magnetization 207 of the second ferromagnetic layer 203. However, as described above, a current which is five times is needed for the magnetization 207 of the second ferromagnetic layer 203 to reverse. Therefore, the magnetization 207 of the second ferromagnetic layer 203 does not reverse.

Figure 4B:
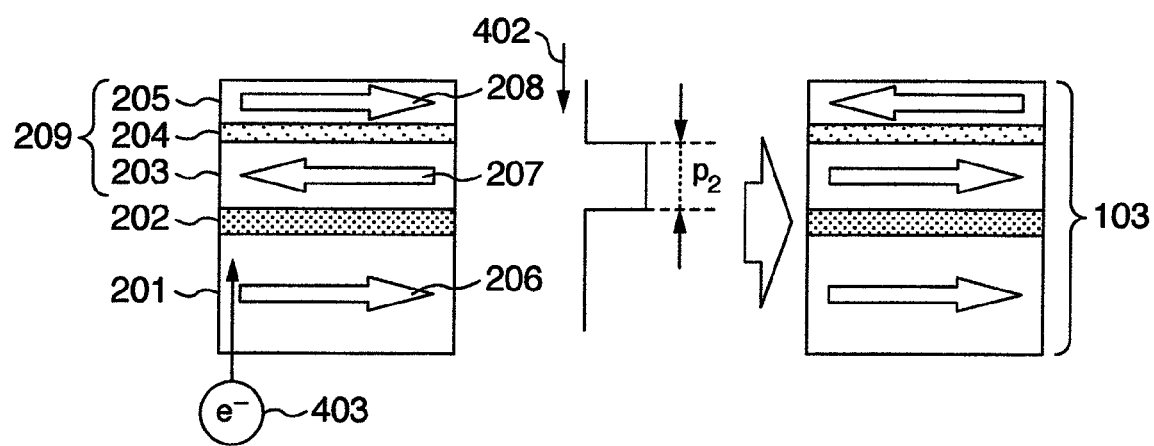
FIG. 4B is another schematic diagram showing an operation principle of the magnetoresistance element shown in FIG. 2.

It is now supposed that the magnetization 206 of the first ferromagnetic layer 201 and the magnetization 207 of the second ferromagnetic layer 203 are disposed so as to respectively have directions which are anti-parallel with each other as shown in FIG. 4B. At the time of writing, a write pulse current 402 is applied in a direction oriented from the third ferromagnetic layer 205 to the first ferromagnetic layer 201. Since the spin of the conducted electrons 403 is opposite in direction to the magnetization 207 of the second ferromagnetic layer 203 at this time, a spin-transfer torque acts. In addition, a pulse width P2 of the write pulse current is made to coincide with an integer times the precession motion period of the magnetization 207 of the second ferromagnetic layer 203. Therefore, this write pulse current can provide only the magnetization 207 of the second ferromagnetic layer 203 with a torque efficiently.

The magnetization 207 of the second ferromagnetic layer 203 is reversed by this torque and it is disposed in parallel with the magnetization 206 of the first ferromagnetic layer 201. If the write pulse current flows after this change of the disposition, then a torque caused by spin transfer acts on the magnetization 208 of the third ferromagnetic layer 205. However, a pulse width of the write pulse current does not coincide with an integer time the precession motion period of the magnetization 208 of the third ferromagnetic layer 205. Accordingly, a current which is five times is needed as described above. Therefore, the magnetization 208 of the third ferromagnetic layer 205 does not reverse. Thus, it becomes possible to reverse the magnetization of only either the second ferromagnetic layer 203 or the third ferromagnetic layer 205 selectively by the spin-transfer torque by designing the second ferromagnetic layer 203 or the third ferromagnetic layer 205 so as to provide $P_1$ and $P_2$ with respective values which are different from each other as heretofore described.

FIG. 2 shows the case where the second ferromagnetic layer 204 is thicker than the third ferromagnetic layer 205. Even in a configuration other than this configuration, however, the above-described operation becomes possible as long as the two ferromagnetic layers are different from each other in precession motion period.

At the time of reading, a read pulse current which is smaller than the write pulse current to an extent that writing is not conducted. In addition, a pulse width of the read pulse current is prevented from coinciding with an integer times the precession motion period of each of the magnetization 207 of the second ferromagnetic layer 203 and the magnetization 208 of the third ferromagnetic layer 205. By adopting this pulse width, it becomes possible to prevent writing from being conducted by mistake during reading.

As for materials of the first ferromagnetic layer 201, the second ferromagnetic layer 203 and the third ferromagnetic layer 205, all ferromagnetic materials can be mentioned as their candidates. For example, there are Co, Fe, Ni, CoFe, CoFeB, NiFe and NiFeB and so on. For causing a margin between write pulse currents for implementing the parallel disposition or the anti-parallel disposition to become large, it is desirable to cause the difference in precession motion period between the magnetization 207 of the second ferromagnetic layer 203 and the magnetization 208 of the third ferromagnetic layer 205 to become large. For that purpose, materials having a large difference in magnitude of coercive force and magnitude of magnetization are used as materials of the second ferromagnetic layer 203 and the third ferromagnetic layer 205, respectively. As for the material of the first non-magnetic layer 202, all non-magnetic materials can be mentioned as its candidate. However, a material having a large spin diffusion length is desirable. For example, there are Cu and Ru.

The first non-magnetic layer 202 may be formed of an insulation layer which functions as a tunnel barrier. In this case, the resistance change rate of the magnetoresistance element 103 becomes large. As for the material of the insulation layer, all insulation materials can be mentioned as its candidate. For example, $Al_2O_3$ and MgO and so on can be mentioned. The resistance change rate of the magnetoresistance element in the case where MgO is used for the insulation layer amounts to 500% at the room temperature. As for the material of the second non-magnetic layer 204, all non-magnetic materials can be mentioned as its candidate. However, it is desirable to use a material which causes intense anti-ferromagnetic coupling between the magnetization 207 of the second ferromagnetic layer 203 and the magnetization 208 of the third ferromagnetic layer 205. For example, there are Cu and Ru.

Summarizing the foregoing description, a magnetoresistance element has a structure obtained by laminating or stacking a first ferromagnetic layer, a first non-magnetic layer, a second ferromagnetic layer, a second non-magnetic layer and a third ferromagnetic layer in this order. Magnetization of the first ferromagnetic layer is fixed in one direction. Magnetization of the second ferromagnetic layer and magnetization of the third ferromagnetic layer are coupled so as to be anti-parallel with each other via the second non-magnetic layer. The second ferromagnetic layer and the third ferromagnetic layer are controlled so as to differ from each other in precession motion period of magnetization. A write pulse current is applied to the magnetoresistance element in a single direction. A pulse width of the write pulse current is made to coincide with an integer times a precession motion period of the magnetization of the second ferromagnetic layer or an integer times a precession motion period of the magnetization of the third ferromagnetic layer according to information to be written. In response to the write pulse current having a pulse width which is an integer times the precession motion period of the magnetization, a spin-transfer torque acts on the second ferromagnetic layer or the third ferromagnetic layer selectively, resulting in magnetization reversal. The magnetization of the second ferromagnetic layer and the magnetization of the third ferromagnetic layer are coupled so as to be always anti-parallel with each other. As a result, writing into the TMR element can be conducted with a current in the single direction. A magnetic recording apparatus including magnetoresistance elements is provided with a structure having a magnetoresistance element at each of intersections of a plurality of first lines which extend in parallel with each other and a plurality of second lines which intersect the first lines and which extend in parallel with each other. A switching element is connected to each magnetoresistance element electrically in series. This switching element is an element which exhibits rectification characteristics by letting flow a current in a single direction, and it is not as large as a transistor. The first ferromagnetic layer is electrically connected to one of the first lines via the switching element. The third ferromagnetic layer is electrically connected to one of the second lines. In the magnetic recording apparatus having this structure, only a selected switching element is pulse-driven so as to be forward-biased and consequently it is possible to apply a unidirectional write pulse current.

Figure 5:
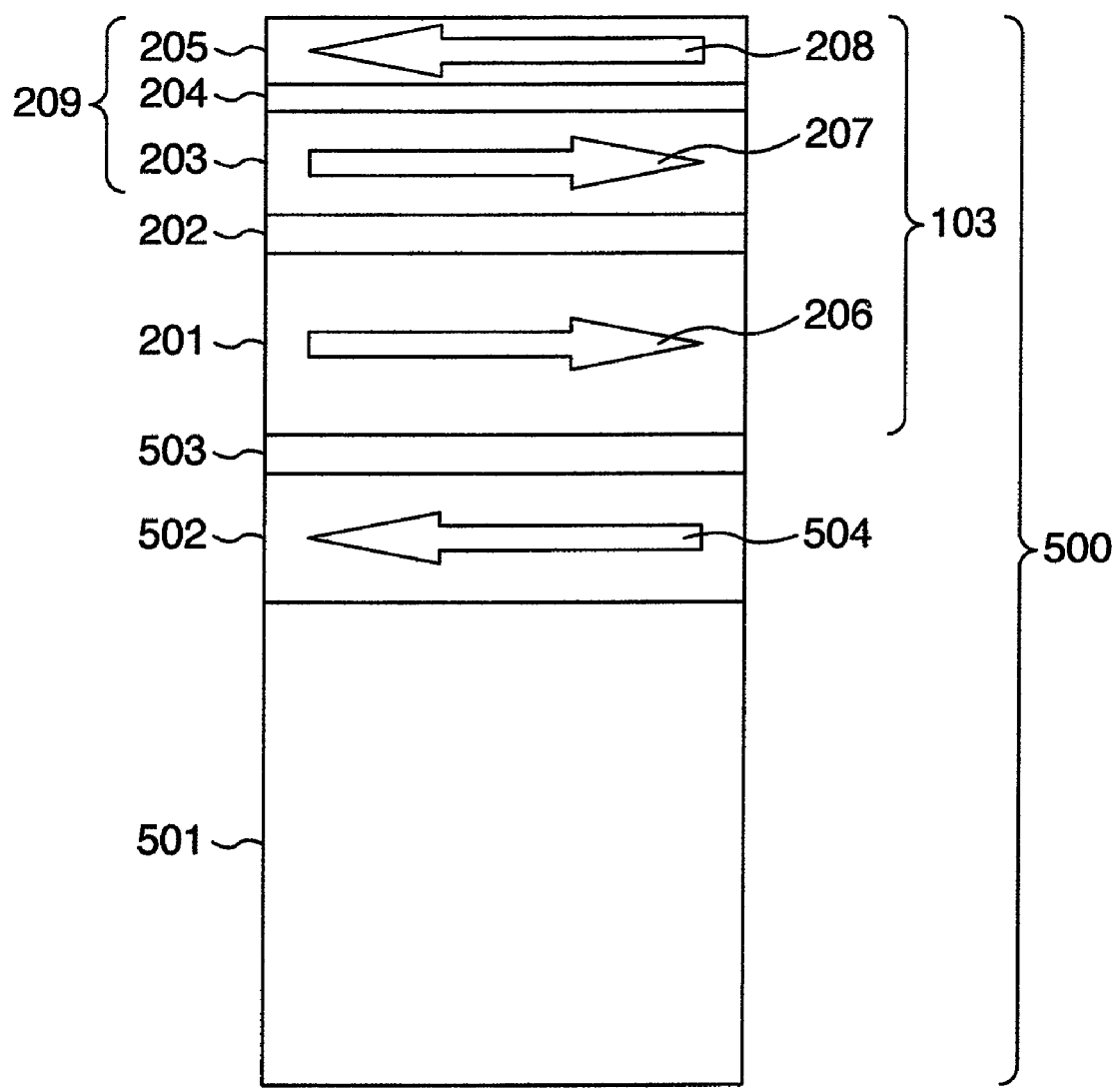
FIG. 5 is a sectional view of the magnetoresistance element shown in FIG. 2 in the case where it is equipped with an antiferromagnetic layer.

As shown in FIG. 5, the magnetoresistance element 103 may be used on a laminated substance 500 having a structure obtained by laminating or stacking a first anti-ferromagnetic layer 501, a fourth ferromagnetic layer 502 and a third non-magnetic layer 503 in this order. In this case, the fourth ferromagnetic layer 503 is connected or coupled to the first ferromagnetic layer 201. By using this structure, a magnetization direction 504 of the fourth ferromagnetic layer is fixed strongly by the first anti-ferromagnetic layer 501.

The magnetization 504 of the fourth ferromagnetic layer 502 and the magnetization 306 of the first ferromagnetic layer 301 are coupled so as to be anti-parallel with each other by the third non-magnetic layer 503. This results in a structure in which a magnetic line of force is closed between the magnetization 206 of the first ferromagnetic layer 201 and the magnetization 504 of the fourth ferromagnetic layer 502. As a result, influence of leak magnetic fields from the first ferromagnetic layer 201 and the fourth ferromagnetic layer 502 can be made small. As for the material of the first anti-ferromagnetic layer 501, all anti-ferromagnetic materials can be mentioned as its candidate. For example, there are PtMn and MnIr. As for the material of the fourth ferromagnetic layer 502, all ferromagnetic materials can be mentioned as its candidate. For example, there are Co, Fe, Ni, CoFe, CoFeB, NiFe and NiFeB. As for the material of the third non-magnetic layer 503, all non-magnetic materials can be mentioned as its candidate. However, it is desirable to use a material which causes intense anti-ferromagnetic coupling between the magnetization 206 of the first ferromagnetic layer 201 and the magnetization 504 of the fourth ferromagnetic layer 502. For example, there are Cu and Ru.

Figure 6:
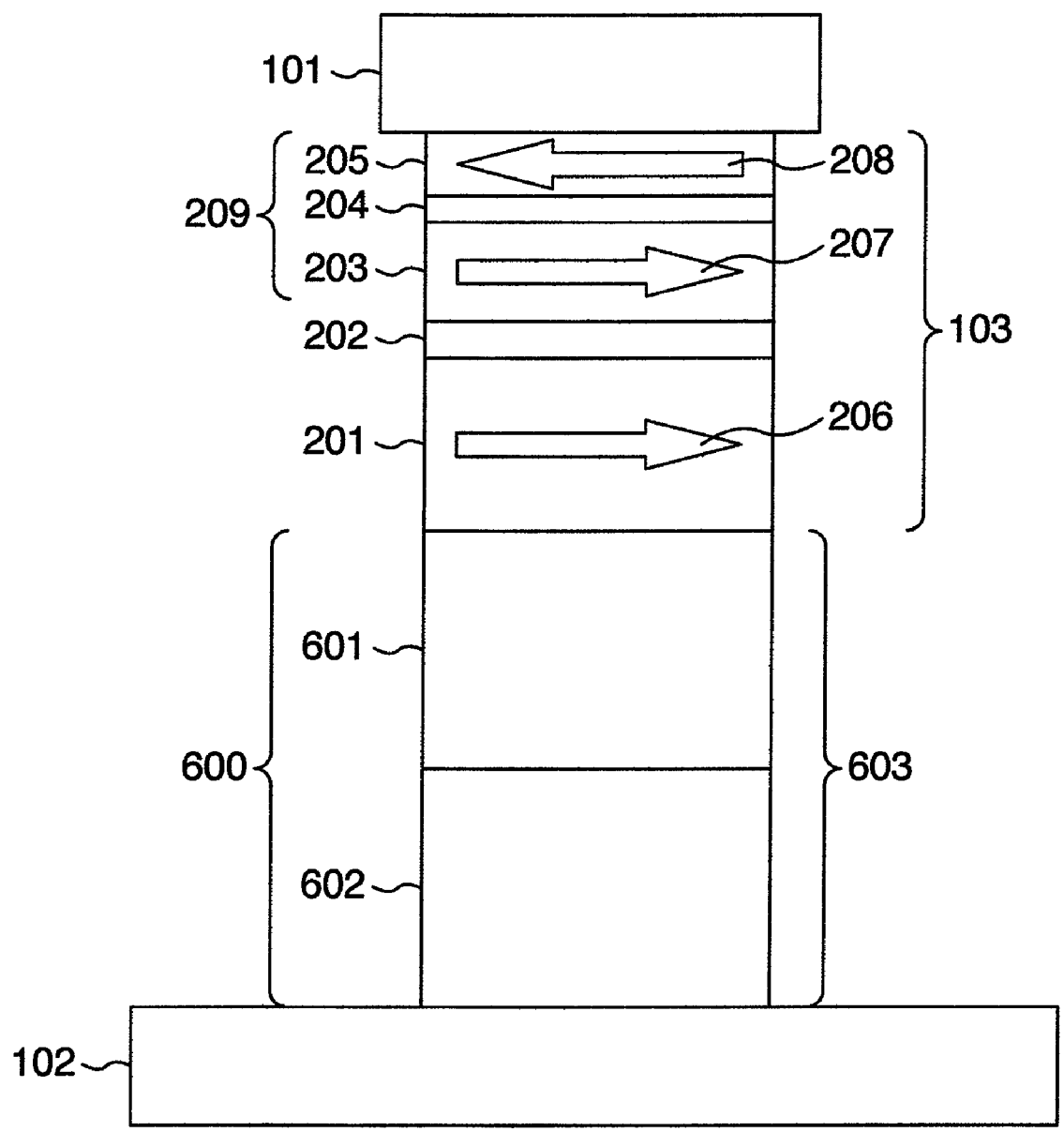
FIG. 6 is a sectional view of the magnetoresistance element shown in FIG. 2 in the case where it is equipped with a PN junction.

The switching element 104 for implementing the write operation may be a PN diode 600 as shown in FIG. 6. The PN diode 600 has a structure in which a P-type semiconductor 601 (anode) and an N-type semiconductor 602 (cathode) are joined. The P-type semiconductor 601 is electrically connected to the first ferromagnetic layer 201 in the magnetoresistance element 102. The N-type semiconductor 602 is electrically connected to one of the word lines 102. At the time of reading or writing, only a PN diode 600 located at an intersection of the selected bit line 101 and word line 102 is pulse-driven so as to be forward-biased. In this case, the bit line assumes a write voltage level, and the word line is grounded. As a result, a current flows only through a selected magnetoresistance element in a direction oriented from the bit line 101 to the word line 102.

Second Embodiment

In the magnetoresistance element 103 according to the first embodiment, a pulse current is applied in a direction oriented from the first ferromagnetic layer 201 to the third ferromagnetic layer 205 at the time of reading or writing. Electrons are conducted from the third ferromagnetic layer 205 to the first ferromagnetic layer 201. Among electrons which have arrived at the first ferromagnetic layer 201 at this time, spin electrons having the same direction as that of the magnetization 206 of the first ferromagnetic layer 201 pass through the first ferromagnetic layer 201. However, spin electrons which are opposite in direction to the magnetization 206 of the first ferromagnetic layer 201 are reflected by the first ferromagnetic layer 201.

It is now supposed that the magnetization 206 of the first ferromagnetic layer 201 and the magnetization 207 of the second ferromagnetic layer 203 are disposed so as to be parallel in direction. At this time, the spin of electrons reflected by the first ferromagnetic layer 201 is opposite in direction to the magnetization 206 of the first ferromagnetic layer 201. Therefore, a spin-transfer torque acts on the magnetization 207 of the second ferromagnetic layer 207. The pulse width of the pulse current applied at this time is made to coincide with an integer times the precession motion period of the magnetization 207 of the second ferromagnetic layer 203. As a result, the magnetization 207 of the second ferromagnetic layer 203 reverses, and consequently the magnetization 207 of the second ferromagnetic layer 203 is disposed so as to be anti-parallel with the magnetization 206 of the first ferromagnetic layer 201.

It is now supposed that the magnetization 206 of the first ferromagnetic layer 201 and the magnetization 207 of the second ferromagnetic layer 203 are disposed so as to be anti-parallel in direction. At this time, the spin of electrons reflected by the first ferromagnetic layer 201 is opposite in direction to the magnetization 206 of the first ferromagnetic layer 201. Therefore, a spin-transfer torque acts on the magnetization 208 of the third ferromagnetic layer 205. The pulse width of the pulse current applied at this time is made to coincide with an integer times the precession motion period of the magnetization 208 of the third ferromagnetic layer 205. As a result, the magnetization 208 of the third ferromagnetic layer 205 reverses. Since the magnetization 207 of the second ferromagnetic layer 203, which is in anti-ferromagnetic coupling with the magnetization 208 of the third ferromagnetic layer 205, also reverses, the magnetization 207 of the second ferromagnetic layer 203 is disposed in parallel with the magnetization 206 of the first ferromagnetic layer 201. In the same way as the first embodiment, the magnetoresistance element 103 may be replaced with the magnetoresistance element 500.

The switching element 104 for implementing the write operation may be the PN diode 600. In the PN diode 600, the P-type semiconductor 601 is electrically connected to one of the word lines 102. The N-type semiconductor 602 is electrically connected to the first ferromagnetic layer 201 in the magnetoresistance element 103.

At the time of reading or writing, only a PN diode 600 selected by the selected bit line 101 and word line 102 is pulse-driven so as to be forward-biased. As a result, a current flows through only a selected magnetoresistance element in a direction oriented from the word line 102 to the bit line 101.

Third Embodiment

Figure 7:
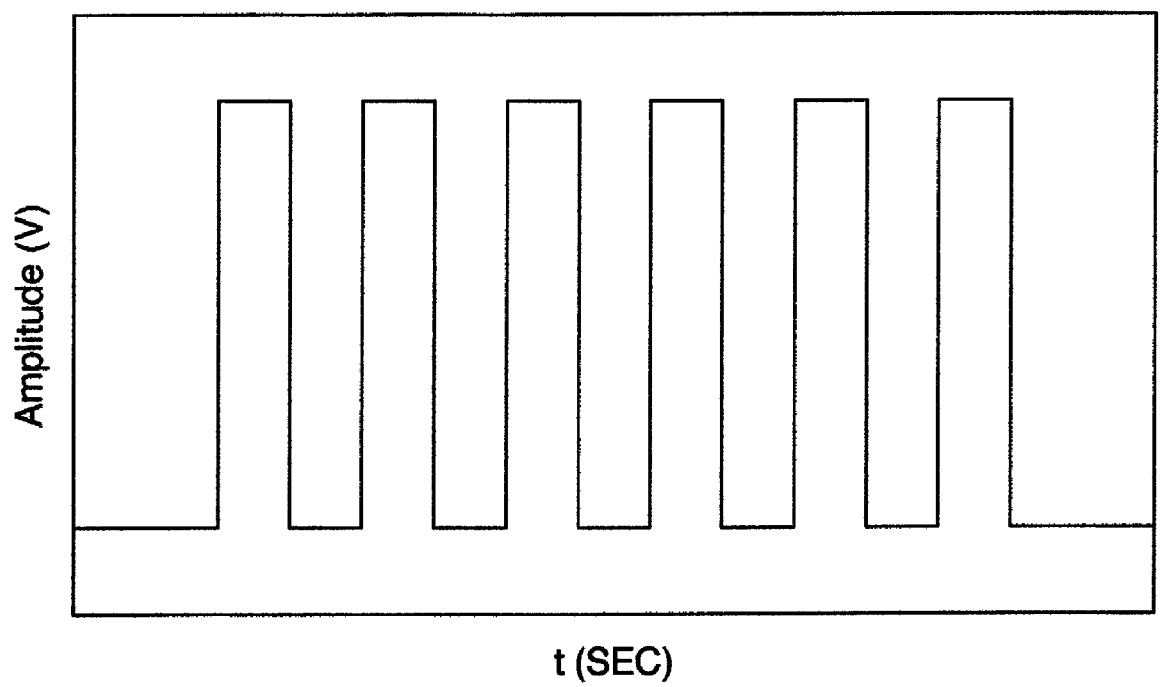
FIG. 7 is a schematic diagram of a pulse waveform in the case where a pulse current is applied continuously.

At the time of writing, a pulse current may be applied (a square wave may be applied) several times consecutively as shown in FIG. 7 instead of applying the write pulse current as a single pulse. (In general, the pulse width corresponds to a time period during which a pulse current is applied, and the inter-pulse space corresponds to a time period during which a pulse current is not applied.) When applying a pulse current consecutively, magnetization reversal can be caused in the second ferromagnetic layer 203 and the third ferromagnetic layer 205 selectively due to the spin-transfer torque, by fixing the pulse width and the pulse space so as to make them equal to an integer times the precession motion period of the magnetization 207 of the second ferromagnetic layer 203 or the magnetization 208 of the third ferromagnetic layer 205.

According to the non-patent document 2, applying a pulse current thus consecutively facilitates occurrence of the magnetization reversal and makes it possible to reduce the write current value. It can be implemented by applying such a current and pulse-driving the bit line 101 and the word line 102 consecutively.

Fourth Embodiment

In the magnetic recording apparatus 103, the switching element 104 may be a Schottky diode. The Schottky diode is electrically connected at its anode to the first ferromagnetic layer 201 in the magnetoresistance element 103. The Schottky diode is electrically connected at its cathode to one of the word lines 102. At the time of reading or writing, only a Schottky diode located at an intersection of a selected bit line 101 and a selected word line 102 is pulse-driven so as to be forward-biased.

In this case, the bit line assumes a write voltage level and the word line is grounded. As a result, a current flows through only a selected magnetoresistance element in a direction oriented from the bit line 101 to the word line 102. Therefore, the operation method described in the first embodiment becomes possible. In general, the Schottky diode is more excellent in high frequency characteristics than the PN diode. Therefore, fast operation of the magnetic memory 100 becomes possible.

Fifth Embodiment

The Schottky diode is electrically connected at its anode to one of the word lines 102. The Schottky diode is electrically connected at its cathode to the first ferromagnetic layer 201 in the magnetoresistance element 103. At the time of reading or writing, only a Schottky diode located at an intersection of a selected bit line 101 and a selected word line 102 is pulse-driven so as to be forward-biased. As a result, a current flows through only a selected magnetoresistance element in a direction oriented from the word line 102 to the bit line 101. Accordingly, the operation method described in the second embodiment becomes possible.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A memory element comprising:
   a magnetoresistance element comprising a first ferromagnetic layer having a fixed magnetization direction, a second ferromagnetic layer having a variable magnetization direction, a third ferromagnetic layer having a variable magnetization direction, a first non-magnetic layer located between the first ferromagnetic layer and the second ferromagnetic layer, and a second non-magnetic layer located between the second ferromagnetic layer and the third ferromagnetic layer; and
   means for applying a current in a film thickness direction of the magnetoresistance element,
   wherein
   a magnetization direction of the second ferromagnetic layer and a magnetization direction of the third ferromagnetic layer are substantially anti-parallel with each other, and
   in conducting a write operation, currents which differ in current pulse width are applied in a film thickness direction of the magnetoresistance element to cause a spin-transfer torque to act on either the second ferromagnetic layer or the third ferromagnetic layer and cause magnetization reversal therein.

2. The memory element according to claim 1, wherein the second ferromagnetic layer and the third ferromagnetic layer are in anti-parallel coupling with each other via the second non-magnetic layer.

3. The memory element according to claim 2, wherein, at the time of the write operation,
when reversing the magnetization direction of the third ferromagnetic layer with a spin-transfer torque, a current having a first pulse width is applied in a direction oriented from the third ferromagnetic layer to the first ferromagnetic layer, and
when reversing the magnetization direction of the second ferromagnetic layer with a spin-transfer torque, a current having a second pulse width is applied in the direction oriented from the third ferromagnetic layer to the first ferromagnetic layer.

4. The memory element according to claim 3, wherein,
when currents which differ in pulse width are applied in the direction oriented from the third ferromagnetic layer to the first ferromagnetic layer at the time of the write operation,
spin electrons which are substantially parallel with the magnetization direction of the first ferromagnetic layer are conducted to the second ferromagnetic layer, the second non-magnetic layer and the third ferromagnetic layer via the first ferromagnetic layer and the first non-magnetic layer.

5. The memory element according to claim 2, wherein, at the time of the write operation,
when reversing the magnetization direction of the second ferromagnetic layer with a spin-transfer torque, a current having a first pulse width is applied in a direction oriented from the first ferromagnetic layer to the third ferromagnetic layer, and
when reversing the magnetization direction of the third ferromagnetic layer with a spin-transfer torque, a current having a second pulse width is applied in the direction oriented from the first ferromagnetic layer to the third ferromagnetic layer.

6. The memory element according to claim 5, wherein
when currents which differ in pulse width are applied in the direction oriented from the first ferromagnetic layer to the third ferromagnetic layer at the time of the write operation,
conduction electrons are conducted in a direction oriented from the third ferromagnetic layer to the first ferromagnetic layer, and
spin electrons which are substantially anti-parallel with the magnetization direction of the first ferromagnetic layer are reflected at the first ferromagnetic layer and conducted to the second ferromagnetic layer, the second non-magnetic layer and the third ferromagnetic layer.

7. The memory element according to claim 2, wherein
the current having the first pulse width is based on a precession motion period of the third ferromagnetic layer, and
the current having the second pulse width is based on a precession motion period of the second ferromagnetic layer.

8. The memory element according to claim 2, wherein
the current having the first pulse width is based on an integer times a precession motion period of the third ferromagnetic layer, and
the current having the second pulse width is based on an integer times a precession motion period of the second ferromagnetic layer.

9. The memory element according to claim 2, wherein
the current having the first pulse width is based on a film thickness of the third ferromagnetic layer, and
the current having the second pulse width is based on a film thickness of the second ferromagnetic layer.

10. The memory element according to claim 3, wherein
if the magnetization direction of the first ferromagnetic layer and the magnetization direction of the second ferromagnetic layer are parallel with each other, then a spin-transfer torque acts on the third ferromagnetic layer, and
if the magnetization direction of the first ferromagnetic layer and the magnetization direction of the second ferromagnetic layer are anti-parallel with each other, then a spin-transfer torque acts on the second ferromagnetic layer and reverses the magnetization.

11. The memory element according to claim 1, wherein at the time of a read operation, a current which is smaller than a current applied at the time of the write operation is applied.

12. The memory element according to claim 2, wherein
the magnetoresistance element further comprises a third non-magnetic layer formed on a face of the first ferromagnetic layer opposite from the first non-magnetic layer, a first anti-ferromagnetic layer, and a fourth ferromagnetic layer formed between the third non-magnetic layer and the first anti-ferromagnetic layer,
a magnetization direction of the fourth ferromagnetic layer is fixed by the first anti-ferromagnetic layer, and
the first ferromagnetic layer and the fourth ferromagnetic layer are in anti-parallel coupling with each other via the third non-magnetic layer.

13. The memory element according to claim 1, wherein the first non-magnetic layer is an insulation tunnel barrier layer.

14. The memory element according to claim 1, wherein the current which differs in current pulse width at the time of the write operation is applied as a single pulse.

15. The memory element according to claim 1, wherein the current which differs in current pulse width at the time of the write operation is applied as consecutive pulses.

16. The memory element according to claim 15, wherein each of the pulse width and inter-pulse space at the time of the write operation is equal to an integer times a precession motion period of each of the second ferromagnetic layer and the third ferromagnetic layer.

17. A memory comprising:
a plurality of first wiring lines disposed substantially in parallel;
a plurality of second wiring lines disposed so as to intersect the first wiring lines and be substantially in parallel with each other;
a plurality of magnetoresistance elements disposed at intersections of the first wiring lines and the second wiring lines; and
switching elements disposed respectively between the magnetoresistance elements and the first wiring lines,
wherein
each of the magnetoresistance elements comprises a first ferromagnetic layer having a fixed magnetization direction, a second ferromagnetic layer having a variable magnetization direction, a third ferromagnetic layer having a variable magnetization direction, a first non-magnetic layer located between the first ferromagnetic layer and the second ferromagnetic layer, and a second non-magnetic layer located between the second ferromagnetic layer and the third ferromagnetic layer, and a magnetization direction of the second ferromagnetic layer and a magnetization direction of the third ferromagnetic layer are substantially anti-parallel with each other, and the third ferromagnetic layer is electrically connected to an associated one of the second wiring lines and the first ferromagnetic layer is electrically connected to an associated one of the first wiring lines via an associated one of the switching elements, when conducting a write operation, currents which differ in current pulse width are applied in a film thickness direction of the magnetoresistance element to cause a spin-transfer torque to act on either the second ferromagnetic layer or the third ferromagnetic layer and cause magnetization reversal therein.

18. The memory according to claim 17, wherein the second ferromagnetic layer and the third ferromagnetic layer are in anti-parallel coupling with each other via the second non-magnetic layer.

19. The memory according to claim 17, wherein each of the switching elements is a diode.

20. A write operation method for recording information in a magnetic memory element by using a spin-transfer torque, wherein the magnetic memory element comprises a magnetoresistance element, and means for applying a current in a film thickness direction of the magnetoresistance element, the magnetoresistance element comprises a first ferromagnetic layer having a fixed magnetization direction, a second ferromagnetic layer having a variable magnetization direction, a third ferromagnetic layer having a variable magnetization direction, a first non-magnetic layer located between the first ferromagnetic layer and the second ferromagnetic layer, and a second non-magnetic layer located between the second ferromagnetic layer and the third ferromagnetic layer, and a magnetization direction of the second ferromagnetic layer and a magnetization direction of the third ferromagnetic layer are substantially anti-parallel with each other, and currents which differ in current pulse width are applied in a film thickness direction of the magnetoresistance element to cause a spin-transfer torque to act on either the second ferromagnetic layer or the third ferromagnetic layer and cause magnetization reversal therein.

* * * * *